US 6,583,071 B1

(12) United States Patent
Weidman et al.

(10) Patent No.: US 6,583,071 B1
(45) Date of Patent: Jun. 24, 2003

(54) ULTRASONIC SPRAY COATING OF LIQUID PRECURSOR FOR LOW K DIELECTRIC COATINGS (75) Inventors: Timothy Weidman, Sunnyvale, CA (US); Yunfeng Lu, San Jose, CA (US); Michael P Nault, San Jose, CA (US); Michael Barnes, San Ramon, CA (US); Farhad Moghadam, Saratoga, CA (US)

(73) Assignee: Applied Materials Inc., Santa Clara, CA (US)

( * ) Notice: Subject to any disclaimer, the term of this patent is extended or adjusted under 35 U.S.C. 154(b) by 147 days.

(21) Appl. No.: 09/692,660

(22) Filed: Oct. 18, 2000

Related U.S. Application Data
(60) Provisional application No. 60/160,050, filed on Oct. 18, 1999.

(51) Int. Cl.[7] .................. H01L 21/31; H01L 21/469
(52) U.S. Cl. .................. 438/787; 438/761; 438/778; 438/782; 427/240; 427/372.2; 427/452
(58) Field of Search .................. 438/761, 778, 438/782, 787; 427/240, 372.2, 452, 96

(56) References Cited

U.S. PATENT DOCUMENTS

| 4,059,929 A | 11/1977 | Bishop |
| 5,478,435 A | 12/1995 | Murphy et al. |
| 5,548,159 A | 8/1996 | Jeng |
| 5,558,435 A | 9/1996 | Marjo |
| 5,645,891 A | 7/1997 | Liu et al. |
| 5,736,425 A | 4/1998 | Smith et al. |
| 5,747,880 A | 5/1998 | Havemann et al. |
| 5,750,440 A | 5/1998 | Vanell et al. |
| 5,807,607 A | 9/1998 | Smith et al. |
| 5,814,370 A | 9/1998 | Martino et al. |
| 5,834,845 A | 11/1998 | Stolmeijer |
| 5,843,602 A | 12/1998 | Kotake |
| 5,847,443 A | 12/1998 | Cho et al. |
| 5,857,893 A | 1/1999 | Olsen et al. |
| 5,858,457 A | 1/1999 | Brinker et al. |

(List continued on next page.)

FOREIGN PATENT DOCUMENTS

| DE | 81106 R | 7/1998 |
| EP | 0 689 235 B1 | 12/1995 |
| EP | 0 869 515 A1 | 7/1998 |
| WO | 98/24724 | 6/1998 |
| WO | 99/03926 | 1/1999 |
| WO | 99/23101 | 5/1999 |
| WO | 99/37705 | 7/1999 |
| WO | WO 00/06491 | 2/2000 |
| WO | 00/08679 | 2/2000 |
| WO | 00/13221 | 3/2000 |

OTHER PUBLICATIONS

Rust, W., "Using Spin–on Dielectrics to Solve Interconnect Challenges," Channel TechWatch, vol. 10, No. 9 (1997).
Peters L., "Solving the Integration Challenges of Low–k Dielectrics," Semiconductor Int'l, 56–64 (1999).

(List continued on next page.)

Primary Examiner—Alexander Ghyka
(74) Attorney, Agent, or Firm—Townsend and Townsend and Crew (57) ABSTRACT A process for forming a extremely low dielectric constant film over a substrate. The process includes coating a substrate with a solution comprising a soluble source of silicon oxide, water, a solvent, a surfactant and a catalyst using an ultrasonic spray nozzle. The coated substrate is then subsequently treated to harden the solution into an extremely low dielectric constant film.

14 Claims, 3 Drawing Sheets

U.S. PATENT DOCUMENTS

| | | | |
|---|---|---|---|
| 5,858,871 A | | 1/1999 | Jeng |
| 5,868,278 A | | 2/1999 | Chen |
| 5,922,299 A | * | 7/1999 | Bruinsma et al. ............ 423/335 |
| 5,948,482 A | | 9/1999 | Brinker et al. |
| 5,955,140 A | | 9/1999 | Smith et al. |
| 6,011,123 A | | 1/2000 | Kurosawa et al. |
| 6,015,457 A | | 1/2000 | Leung et al. |
| 6,037,275 A | | 3/2000 | Wu et al. |
| 6,048,256 A | | 4/2000 | Obeng et al. |
| 6,066,575 A | * | 5/2000 | Reardon et al. ............ 438/782 |
| 6,070,600 A | | 6/2000 | Grootegoed et al. |
| 6,098,843 A | | 8/2000 | Soberanis et al. |
| 6,107,357 A | | 8/2000 | Hawker et al. |
| 6,120,891 A | | 9/2000 | Balkus, Jr. et al. |
| 6,140,252 A | | 10/2000 | Cho et al. |
| 6,159,295 A | | 12/2000 | Maskara et al. |
| 6,162,583 A | | 12/2000 | Yang et al. |
| 6,162,838 A | | 12/2000 | Kohl |
| 6,163,066 A | | 12/2000 | Forbes et al. |
| 6,168,737 B1 | | 1/2001 | Poco et al. |
| 6,171,645 B1 | | 1/2001 | Smith et al. |
| 6,171,687 B1 | | 1/2001 | Leung et al. |
| 6,172,128 B1 | | 1/2001 | Lau et al. |
| 6,184,260 B1 | | 2/2001 | Zhong |
| 6,187,248 B1 | | 2/2001 | O'Neill et al. |
| 6,197,913 B1 | | 2/2001 | Zhong |
| 6,204,202 B1 | | 3/2001 | Leung et al. |
| 6,208,014 B1 | | 3/2001 | Wu et al. |
| 6,251,473 B1 | * | 6/2001 | Wang et al. ............. 427/126.3 |
| 6,270,846 B1 | | 8/2001 | Brinker et al. |
| 6,277,765 B1 | | 8/2001 | Chen et al. |
| 6,297,459 B1 | | 10/2001 | Wojnarowski et al. |

OTHER PUBLICATIONS

Singer, P., "Dual–Damascene Challenges Dielectric Etch," Semiconductor Int'l., 68–72 (1999).

Hendricks, N., "Low K Materials for IC International Dielectric Applications: An Updated Status on the Leading Candidates," Low K Dielectric Mat. Tech., SEMICON West, B1–B12 (1999).

Millipore Corporation, "IntelliGen™ Dispense System with Impact™ LHVD Filter," Data Sheet, Millipore Corporation, pp. 1–4 (Nov. 1997).

* cited by examiner

ULTRASONIC SPRAY COATING OF LIQUID PRECURSOR FOR LOW K DIELECTRIC COATINGS

CROSS-REFERENCES TO RELATED APPLICATIONS

This application claims the benefit of U.S. Provisional Application Ser. No. 60/160,050, filed Oct. 18, 1999, which is incorporated herein by reference.

BACKGROUND OF THE INVENTION

The present invention relates to the formation of dielectric layers. More particularly, the present invention relates to a method for forming a low dielectric constant film that is particularly useful as a premetal or intermetal dielectric layer in an integrated circuit.

Semiconductor device geometries have dramatically decreased in size since integrated circuits were first introduced several decades ago, and all indications are that this trend will continue on. Today's wafer fabrication plants are routinely producing devices having 0.25 μm and even 0.18 μm feature sizes, and the plants of the future will soon be producing devices having even smaller geometries.

As device sizes become smaller and integration density increases, one issue that has become an increasing concern to semiconductor manufacturers is that of interlevel "crosstalk." Crosstalk is the undesired coupling of an electrical signal on one metal layer onto another metal layer, and arises when two or more layers of metal with intervening insulating or dielectric layers are formed on a substrate. Crosstalk can be reduced by moving the metal layers further apart, minimizing the areas of overlapping metal between metal layers, reducing the dielectric constant of the material between metal layers and combinations of these and other methods. Undesired coupling of electrical signals can also occur between adjacent conductive traces, or lines, within a conductive layer. As device geometries shrink, the conductive lines become closer together and it becomes more important to isolate them from each other.

Another issue that is becoming more of a concern with decreasing feature sizes is the "RC time constant" of a particular trace. Each trace has a resistance, R, that is a product of its cross section and bulk resistivity, among other factors, and a capacitance, C, that is a product of the surface area of the trace and the dielectric constant of the material or the space surrounding the trace, among other factors. If a voltage is applied to one end of the conductive trace, charge does not immediately build up on the trace because of the RC time constant. Similarly, if a voltage is removed from a trace, the trace does not immediately drain to zero. Thus high RC time constants can slow down the operation of a circuit. Unfortunately, shrinking circuit geometries produce narrower traces, which results in higher resistivity. Therefore it is important to reduce the capacitance of the trace, such as by reducing the dielectric constant of the surrounding material between traces, to maintain or reduce the RC time constant.

Hence, in order to further reduce the size of devices on integrated circuits, it has become necessary to use insulators having a low dielectric constant. And as mentioned above, low dielectric constant films are particularly desirable for premetal dielectric (PMD) layers and intermetal dielectric (IMD) layers to reduce the RC time delay of the interconnect metalization, to prevent cross-talk between the different levels of metalization, and to reduce device power consumption.

The traditional insulator used in the fabrication of semiconductor devices has been undoped silicon oxide. Undoped silicon oxide films deposited using conventional CVD techniques may have a dielectric constant (k) as low as approximately 4.0 or 4.2. Many approaches have been proposed for obtaining insulating layers having a lower dielectric constant. Amongst these have been fluorine-doped silicon oxide films (FSG films) that may have a dielectric constant as low as about 3.4 or 3.6.

Several semiconductor manufacturers, materials suppliers and research organizations have focused on identifying and developing dielectric films having a dielectric constant below that of FSG films. These efforts have resulted in the development of low and extremely low dielectric constant films. As used herein, low dielectric constant films are those having a dielectric constant between 3.0 to 2.5 and extremely low dielectric constant ("ELK") films are those having a dielectric constant below 2.5 extending to dielectric constants below 2.0.

Some approaches to developing such low K and ELK films include introducing porosity into known dielectric materials to reduce the material's dielectric constant. Dielectric films when made porous, tend to have lower dielectric constants (the dielectric constant of air is normally 1.0). One method of forming porous oxide films is referred to as the sol gel process, in which high porosity films are produced by hydrolysis and polycondensation of a metal oxide. The sol gel process is a versatile solution process for making ceramic material. In general, the sol gel process involves the transition of a system from a liquid "sol" (mostly colloidal) into a solid "gel" phase. The starting materials used in the preparation of the "sol" are usually inorganic metal salts or metal organic compounds such as metal alkoxides. The precursor solutions are typically deposited on a substrate by spin on methods. In a typical sol gel process, the precursor is subjected to a series of hydrolysis and polymerization reactions to form a colloidal suspension, or a "sol." Further processing of the "sol" enables one to make ceramic materials in different forms.

In one particular sol gel process for forming a porous low dielectric constant film, surfactants act as the template for the film's porosity. The porous film is generally formed by the deposition on a substrate of a sol gel precursor followed by selective evaporation of components of the sol gel precursor to form supramolecular assemblies. The assemblies are then formed into ordered porous films by the pyrolysis of the supramolecular templates at approximately 400° C. However, for this process the pyrolysis step can require as much as four hours to extract the surfactant and thus leave behind a porous silicon oxide film. Such lengths of time are incompatible with the increasing demand for higher processing speeds in modem semiconductor processing.

Figure 1:
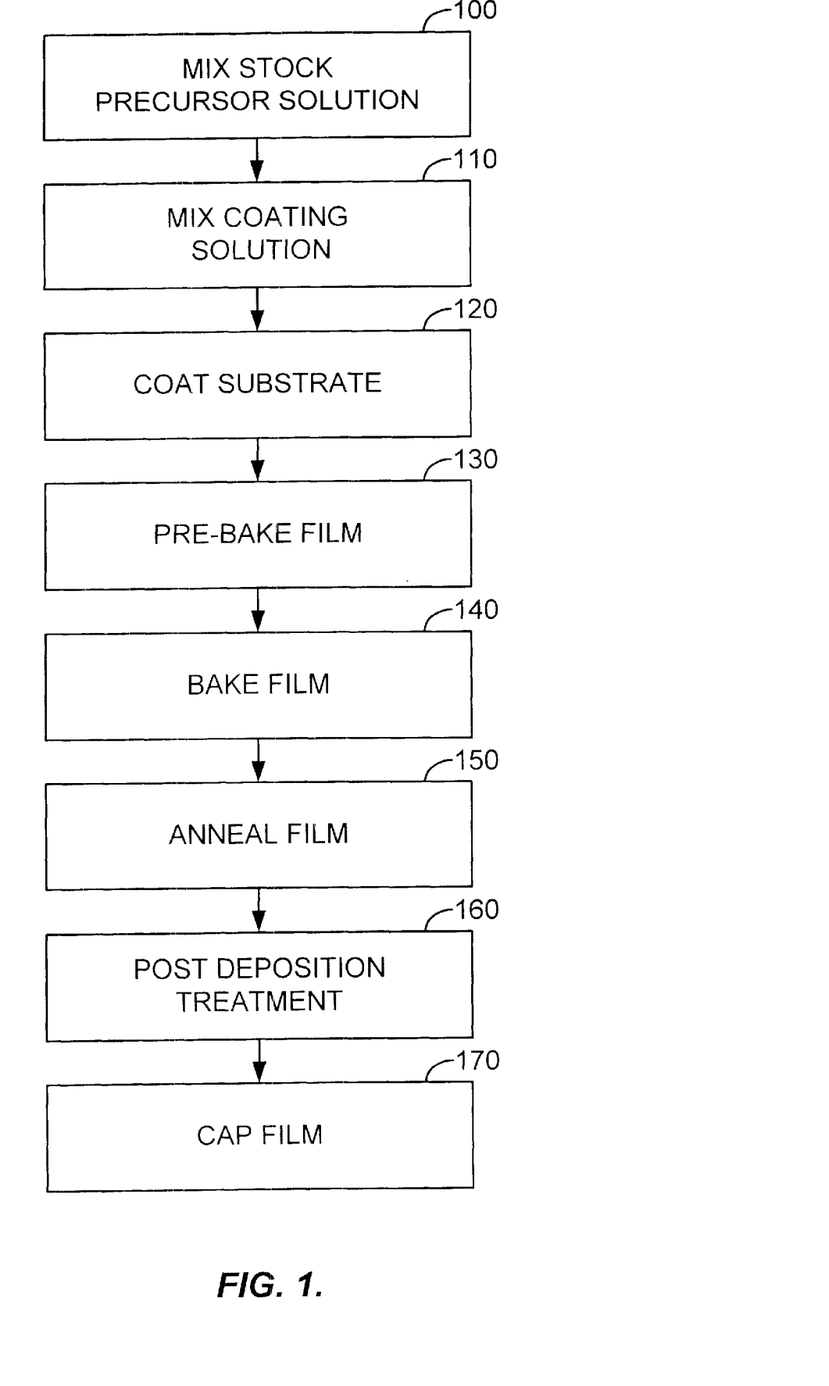
FIG. 1 is a flowchart of a typical process in which a templated sol gel process is used to deposit a porous silicon oxide layer.

FIG. 1 is a flowchart illustrating a basic sol gel process that has been previously proposed to deposit low k dielectric films. As shown in FIG. 1, the first step is the synthesis of the stock precursor solution (step 100). The stock precursor solution is prepared by mixing a soluble silicon oxide source, e.g., TEOS (tetraethoxysilane), water, a solvent, e.g. alcohol, and a catalyst, e.g. hydrochloric acid, at certain prescribed environmental conditions and refluxed for certain time periods at particular mole ratios.

Once the stock solution is obtained, the coating solution is mixed (step 110). The general procedure to prepare the coating solution is to add to the stock solution a surfactant, more TEOS, more water, more solvent, and more catalyst.

Surfactants are used as templates for the porous silica. In later processes the surfactants are baked out, leaving behind a porous silicon oxide film. Typical surfactants exhibit an amphiphilic nature, meaning that they can be both hydrophilic and hydrophobic at the same time. Amphiphilic surfactants posses a hydrophilic head group or groups which has a strong affinity for water and a long hydrophobic tail which repels water. The long hydrophobic tail acts as the template which later provides the pores for the porous film. Amphophiles can aggregate into supramolecular arrays which is precisely the desired structure that needs to be formed as the template for the porous film. Templating oxides around these arrays leads to materials that exhibit precisely defined pore sizes and shapes. The surfactants can be anionic, cationic, or nonionic. The acid catalyst is added to accelerate the condensation reaction of the silica around the supramolecular aggregates.

After the coating solution is mixed it is filtered and deposited on the substrate (step 120) using a spinning process where centrifugal draining ensures that the substrate is adequately coated with the coating solution. The coating solution is then applied onto the surface of the substrate to be coated (typically a silicon wafer) by spin coating. In this process, an excess of the coating solution is poured over the wafer surface after which the wafer is spun, typically at speeds of approximately 2000 rpm, to achieve a uniform film coating the substrate surface. Such processes have been routinely found to provide excellent coating uniformity at relatively high throughput, though typically more than 80% of the applied material is "spun-off" and wasted. The coated substrate is then pre-baked to complete the hydrolysis of the TEOS precursor, continue the gelation process and drive off any remaining solvent from the film (step 130). The temperature range chosen for the pre-bake step allows for the preferential removal of the solvent relative to the water.

The pre-baked substrate is then further baked to form a hard-baked film (step 140). The temperature range chosen for bake step ensures that water gets boiled out of the coating solution. At this stage the film is comprised of a hard-baked matrix of silica and surfactant with the surfactant possessing an interconnected structure characteristic of the type and amount of surfactant employed. The interconnected structure is required to allow for the subsequent surfactant extraction phase. The interconnected structure provides continuous pathways for the subsequently burned off surfactant molecules to escape from porous oxide matrix.

Typical silica-based films often have hydrophilic pore walls and aggressively absorb moisture from the surrounding environment. If water, which has a dielectric constant (k) of about 78, is absorbed into the porous film, then the low k dielectric properties of the film can be detrimentally affected. Often these hydrophilic films are annealed at elevated temperatures to remove moisture, and to burn and extract the surfactant out of the precursor-surfactant matrix, and thus leave behind a porous film exhibiting interconnected pores (step 150). But this is only a temporary solution in a deposition process since the films are still sensitive to moisture contamination following this procedure.

Annealing is often a time consuming process that adds to the processing time of the substrate and results in low throughput rates. Other typical sol gel processes include further post-deposition treatment steps that are aimed at modifying the surface characteristic of the pores to impart various desired properties, such as hydrophobicity, and increased resistance to certain chemicals. A typical treatment that renders the film more stable is treatment with HMDS (hexamethyldisilizane, $[(CH_3)_3—Si—NH—Si—(CH_3)_3]$, in a dehydroxylating process which will remove the hydroxyl groups, replace them with trimethysilyl groups, and render the film hydrophobic (step 160). Finally, the film may be further stabilized by depositing a capping or passivation layer over the porous dielectric layer (step 170).

While the above described sol gel deposition process can be used to deposit ELK films, semiconductor manufacturers continuously seek improvements to existing technology. Accordingly, the semiconductor industry is currently spending much time and effort researching improvements to, as well as alternatives to, processes to deposit extremely low dielectric constant films.

SUMMARY OF THE INVENTION

Embodiments of the present invention provide an alternative technique for coating the liquid ELK precursor formulation onto a substrate such as a silicon wafer. This alternative technique uses an ultrasonic spray nozzle to spray a coating solution over the upper surface of a substrate as part of an ELK film formation process. The use of such an ultrasonic spray nozzle for ELK film formation results in a number of advantages and benefits as discussed more fully below.

In one embodiment of the method of the present invention, an extremely low dielectric constant layer is formed over a substrate by coating the substrate with a solution including a soluble source of silicon oxide, water, a solvent, a surfactant and a catalyst using an ultrasonic spray nozzle. The coated substrate is then subsequently treated to harden the solution into an extremely low dielectric constant film.

In another embodiment, a low dielectric constant film is formed over a substrate by coating the substrate with a liquid low k precursor using an ultrasonic spray nozzle and treating the coated substrate to harden the solution into a low dielectric constant film.

DESCRIPTION OF THE SPECIFIC EMBODIMENTS

Embodiments of the present invention provide a new and more efficient method of depositing extremely low dielectric constant (ELK) films over a substrate. As discussed above, FIG. 1 is a flowchart illustrating one basic sol gel process that has been proposed by others to deposit an ELK film. The inventors have developed an improved technique to coat the substrate with the precursor solution in an ELK deposition process (e.g., step 120 of FIG. 1). The improved process uses an ultrasonic sprayer as opposed to conventional spin-on methods.

Most sol gel based processes for forming porous silicon oxide layers, deposit the coating solution on a substrate using a spin-on method. In contrast, the method of the present invention coats the substrate with the precursor solution using an ultrasonic spray nozzle. The inventors have found that using such a technique provides a number of advantages over spin coating methods. In various embodiments of the present invention, such advantages include, among others, one or more of the following: (i) less waste of excess coating solution; (ii) reduced contamination of the processing chamber's interior; (iii) elimination or reduction of striations formed in the coated film due to radial forces and (iv) elimination or reduction of pore structures formed in the portion of the film near the outer radii of a substrate that are different from pore structures formed near the substrate center due greater centrifugal force at the substrate periphery.

The inventors have also found that a number of coating solutions that would otherwise be possible to use for the formation of ELK films have a very short shelf life and are thus relatively unstable and awkward to deliver in a controllable manner. Some of these solutions may break down rapidly thus making storage of the solutions after mixing but prior to coating difficult or impractical. Some embodiments of the present invention solve this problem by combining two or more components of the solution immediately prior to use as described more fully below.

Figure 2:
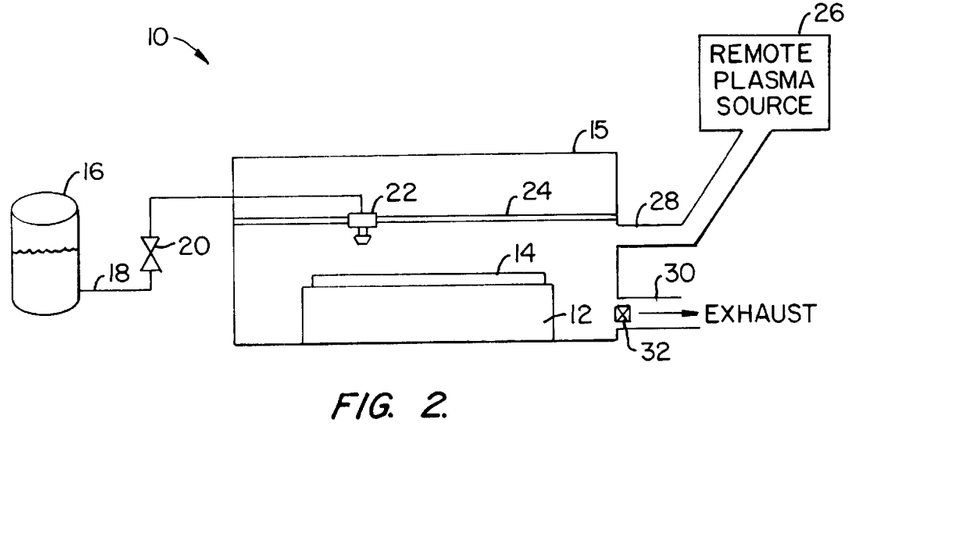
FIG. 2 is a cross-sectional view of a simplified substrate processing chamber according to one embodiment of the present invention.

FIG. 2 is a simplified cross-sectional view of one embodiment according to the present invention of a substrate processing system 10 that includes an ultrasonic spray nozzle that can be used to deposit a liquid ELK coating solution. As shown in FIG. 2, substrate processing system 10 includes a sealed chamber 15 in which a substrate 14 can be positioned on a support 12 for processing. During film deposition, an ultrasonic spray nozzle 22 sprays a liquid precursor stored in a dispensing tank 16 over substrate 14. Prior to storage in dispensing tank 16, the coating solution can be formed as described in steps 100 and 110 of FIG. 1.

Figure 3:
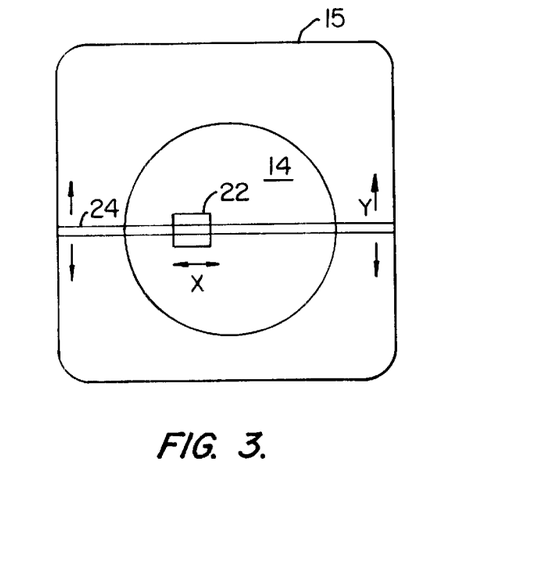
FIG. 3 is a top view of the inside of the substrate processing chamber shown in FIG. 2.
Figure 4:
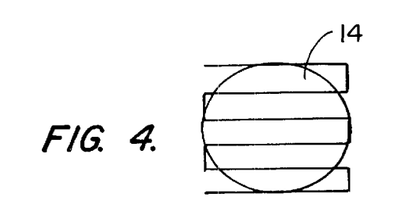
FIG. 4 is an example of one path that an ultrasonic spray nozzle can be moved in to coat the surface of a substrate according to one embodiment of the present invention.

The rate at which the liquid precursor is delivered to nozzle 22 via a delivery line 18 is controlled by a valve 20. Spray nozzle 22 can travel along the diameter of substrate 14 via a track 24. In one embodiment, track 24 is a horizontal member connected to opposing walls of chamber 15 and substrate support 12 includes a mechanism that allows substrate 14 to rotate beneath spay nozzle 22. The combination of substrate rotation and nozzle movement along track 24 allows the liquid precursor solution to be delivered uniformly across the entire substrate surface. In another embodiment shown in FIG. 3, track 24 moves within chamber 15 in a direction Y generally perpendicular to the movement of nozzle 22 along track 24 (direction X). This technique allows nozzle 22 to be scanned across the surface of the substrate in a manner (e.g., in a serpentine path as shown in FIG. 4) that promotes uniform distribution of the liquid precursor over the entire substrate surface.

Chamber 15 forms an enclosure in which film deposition can occur without exposure to the outside ambient. The spray coating process occurs within the controlled atmosphere of chamber 15 such that the atmosphere remains saturated or partially saturated with solvent vapor. Under these conditions, the solvent will not evaporate (or evaporates much more slowly), allowing the substrate surface to be uniformly wet with the coating solution. During the spray process, ultrasound generated from the spray head disperses the liquid precursor and leads to the formation of precursor droplets. Coalescence of these droplets on the substrate surface are driven by the subsequent removal of solvent vapor leading to formation of a mesostructured thin film.

Coating substrate 14 with coating solution in a contained environment such as chamber 15 allows for the use of solvents that have a relatively low boiling point (less than 100° C.). Such solvents generally cannot be used in an open atmosphere spin coating environment due to safety constraints. Examples of such low boiling point solvents that are usable in certain embodiments of the invention include ethanol, methanol and isopropanol.

Processing within chamber 15 can occur at atmospheric pressure (760 Torr) or at a reduced pressurized level based on the positioning of a throttle valve 32 that controls gas flow through an exhaust line 30. The contained environment within chamber 15 eliminates solvent evaporation problems associated with open, spin coating systems and it allows solvent vapor within the chamber to be pumped out of the chamber through exhaust port 30. If desired, the exhausted vapor can be trapped for subsequent disposal or recycling in an appropriate trap (not shown) connected to port 30 downstream of chamber 15.

A remote plasma source 26 is coupled to chamber 15 via a gas inlet port 28. Remote plasma source can be used to form a plasma of an etchant gas to effectively clean chamber 15 between deposition processes. In such a clean process, reactive species (e.g., species generated from a plasma formed from a fluorine-containing gas such as $NF_3$, $SF_6$, $C_3F_8$ and the like) generated within remote plasma source 26 are transported into chamber 15 through inlet port 28. Throttle valve 32 is controlled to set the pressure within chamber 15 to a reduced level (e.g., less than 10 Torr). The reactive species react with deposition byproducts that have built up within chamber 15 from previous deposition processes performed within the chamber to convert the byproducts into gaseous form. Once in gaseous form, the byproducts are then pumped out of the chamber through exhaust line 30. In this manner, chamber 15 does not have to be opened for wet cleaning operations (or if still used such wet cleaning operations can be used much less frequently, e.g., once every 10,000 wafers).

Alternatively, instead of including remote plasma source 26, system 10 can include a vapor phase delivery apparatus (not shown). Such a vapor phase delivery apparatus delivers a reagent such as HF to clean residue off the interior chamber surfaces between ELK film deposition processes.

As described above, the spray coating can be done using several different techniques. In one technique, nozzle 22 travels along a track 24 while spraying solution toward a spinning substrate surface. The path taken by nozzle 22 along track 24 using this technique should ensure that sprayed solution reaches the center of the substrate to the substrate edge. This, along with the spinning of the substrate while the solution is being sprayed, ensures that the solution is evenly sprayed across the entire substrate surface. The solution further spreads during the spinning to coat the substrate in a uniform manner. In some embodiments the rate at which the wafer is spun during the spray coating process is approximately equal to what it would be if a spin coating technique were employed. In other embodiments, however, the spin rate can be less.

In another technique, substrate 14 is not spun during the ultrasonic spray coating process and instead, nozzle 22 is scanned across the substrate surface. FIG. 4 shows one example of a path 40 that nozzle 22 can be moved in while the surface of a substrate 14 is coated. A person of skill in the art will readily appreciate that path 40 is just one example of many that can be employed to coat a substrate. When using a scanning or a similar technique where the substrate is not spun under nozzle 22 steps should be taken to prevent deposition of the coating solution on the edge of the substrate. In one embodiment of the invention, a cover ring (not shown in any of the figures) can be employed to block the spray of solution from nozzle 22 onto the substrate edge. Such a cover ring may, for example, be made from a ceramic material and positioned so that an inner surface of the ring overlies the substrate edge maintained a slight distance above the substrate. Such a cover ring may also be used in embodiments where the substrate is spun during spray coating. Generally, if the spin rate of the substrate is high enough, centrifugal force will prevent the coating solution from adhering to the substrate edge. In embodiments where the spin rate is considerably slower than would be used if the solution were spin coated, however, a cover ring provides a definite advantage.

Another method of preventing deposition of coating solution from adhering to the substrate edge involves a hybrid spray and spin process. In this hybrid technique, after the solution is sprayed onto the substrate within the controlled atmosphere of chamber 15, the substrate is transferred to a spin table to improve coating uniformity and accelerate drying. The spin coating step may be performed after opening the controlled atmosphere coating chamber to air and attaching the system to an exhaust manifold to remove solvent vapors. Alternatively, spray or spray/spin coating and drying can be performed under reduced pressure by evacuating the coating chamber using a vacuum pump with an optional trap to collect evolved solvent vapor. One advantage here is the ability to exclude oxygen and thereby possibility of accidental ignition and combustion of solvent saturated air. Another advantage is the ability to confine and potentially recover solvent vapors—unlike conventional spin coating which creates large volumes of solvent contaminated exhaust which is difficult and expensive to purify. Even when performed as a hybrid spray and spin process, significantly less material is spun off the substrate and onto the container walls thereby reducing the amount of solvent usage and waste associated with spin-bowl cleaning.

Figure 5:
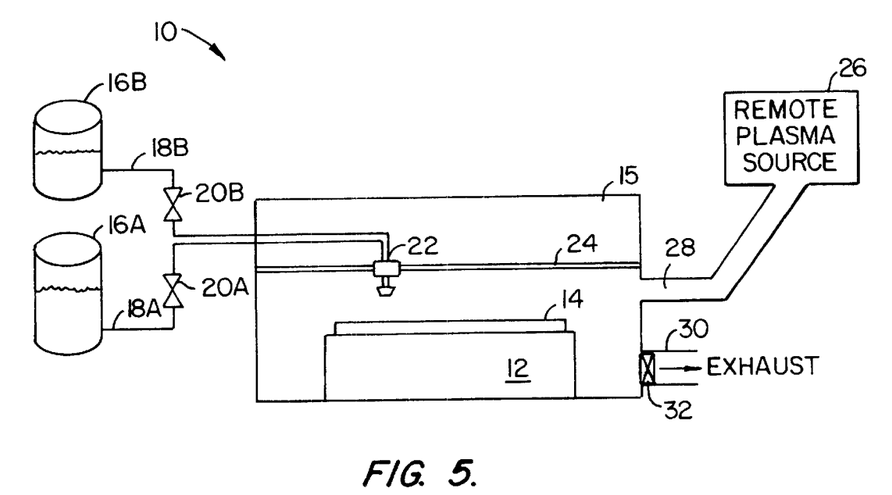
FIG. 5 is a cross-sectional view of a simplified substrate processing chamber according to another embodiment of the present invention.

In another embodiment of the apparatus of the present invention shown in FIG. 5, multiple liquid sources 16A, 16B are provided to ultrasonic spray nozzle 22. The delivery rate of these multiple sources is controlled by valves 20A, 20B operatively coupled to delivery lines 18A, 18B. The lines 18A, 18B can combine into a single line using a T-connection or similar mechanism as would be understood by a person of skill in the art either prior to ultrasonic spray nozzle 22 or at the nozzle. Ultrasonic spray nozzle 22 homogenizes the multiple sources so that a separate mixing tank is not necessary although alternative embodiments (not shown) may include such a tank for real-time solution mixing.

Embodiments of the invention similar to the embodiment of FIG. 5 enable the use of coating solutions that may otherwise breakdown and/or become ineffective prior to use. To this end, in embodiments where solution mixing is done in nozzle 22, in the line immediately prior to nozzle 22 or in a dedicated point-of-use mixing tank, the solution would not be mixed as described with respect to steps 100 and 110 of FIG. 1.

In one embodiment of the method of the present invention, the coating solution supplied to ultrasonic spray nozzle 22 comprises a silica precursor composed primarily of a silicon/oxygen compound, water, a solvent, a surfactant and a catalyst. The silicon/oxygen compound can be, for example, tetraethylorthosilicate, tetramethoxy silane, phenlytriethyloxy, methyltriethoxy silane and combinations thereof. The solvent can be, for example, ethanol, isopropanol, propylene glycol monopropyl ether, n-propanol, n-butanol, t-butanol, ethylene glycol and combinations thereof. The surfactant can be a non-ionic surfactant selected, for example, from any of the following compounds: polyoxythylene oxides, propylene oxides, polyethylene oxides triblock copolymers, octaethylene glycol monodecyl ether, octaethylene glycol monohexadecyl ether, Triton™ 100, Triton™ 114 and related compounds and combinations thereof. In one example, the catalyst is an acid catalyst such as nitric acid. Thickness can be controlled by control the coating time and ultrasonic intensity.

After the coating solution is spray coated onto the substrate, the coated solution is then hardened to form an interconnected porous structured oxide film. Such hardening and other treatment steps can be performed as described above in steps 130–170 of FIG. 1. In one embodiment the hardening of the film is performed as described in detail below.

After coating, the substrate is pre-baked on a 90° C. hot plate at atmospheric pressure for five minutes to vaporize and drive the alcohol out of the solution (step 130). A temperature of 90° C. allows for this step to preferentially remove the alcohol relative to the water. The pre-baked substrate is then baked in a 140° C. oven at atmospheric pressure for 5 minutes to form a hard-baked film (step 140). A temperature of 140° C. ensures that the water is boiled out of the precursor-surfactant solution. After baking the substrate, the film comprises a hard-baked matrix of silica and surfactant with the surfactant possessing an interconnected structure. The interconnected structure provides continuous pathways for the burned off surfactant molecules to escape from porous oxide matrix during the subsequent surfactant extraction phase.

The hard baked film is then annealed to burn off and extract the surfactants from the deposited film and to remove any residual moisture (step 150). The annealing phase can be carried out in a nitrogen, helium and/or oxygen environment at a temperature of between about 350–450° C. and a pressure of between about 5 Torr to atmospheric pressure. Inert atmosphere anneals generally require longer anneal times. For example, the anneal time required in a helium or nitrogen environment at a pressure of 700 Torr is between about 10–20 minutes. The anneal time required in an oxidizing environment, however, is on the order of two minutes. The shorter time for the oxygen anneal is due to the fact that the surfactant is burned out an extracted more rapidly.

Thereafter, post deposition processes may be required that are aimed at modifying the surface characteristic of the pores to impart various desired properties, such as hydrophobicity, and increased resistance to certain chemicals. A typical treatment that renders the film more stable is treatment with HMDS (hexamethyldisilizane, [$(CH_3)_3$—Si—NH—Si—$(CH_3)_3$, +], in a dehydroxylating process which will remove the hydroxyl groups, replace them with trimethysilyl groups, and render the film hydrophobic(step 160). Alternatively, or in conjunction with such a silylation step, the porous material may be rendered more hydrophobic by the addition of an alkyl substituted silicon precursor, such as $CH_3Si(OCH_2CH_3)_3$ methyl triethoxysilane or MTES to the precursor formulation.

For most intended applications as an extreme low K dielectric layer for copper damascene applications, the annealed film is then capped, as described in detail in concurrently filed application entitled "Capping Layers for Extreme Low K Dielectric Films," Ser. No. 09/692,527.

DESCRIPTION OF EXEMPLARY PROCESSES TO TEST EMBODIMENTS OF THE PRESENT INVENTION

In order to further demonstrate the effectiveness of the method of the present invention, the inventors deposited three different ELK film using the following deposition processes: (1) coating a substrate using an ultrasonic spray nozzle and subsequently spinning the substrate at 2000 rpm; (2) coating a substrate with a thin formulation of coating solution (a spray time of about 1 second) using an ultrasonic spray without spinning the substrate during or after the coating process and (3) coating a substrate with a thick formulation of coating solution (a spray time of about 4 seconds) using an ultrasonic spray without spinning the substrate during or after the coating process. For these tests, an ultrasonic sprayer (Sonotek Microspray Ultrasonic Atomizing Nozzle # 8700-120MS and a broadband ultrasonic generator) was used as nozzle 22 to spray the coating solution onto substrates without spinning the substrates. A syringe containing 1 ml of solution was connected to the spray head for each process and the solution was sprayed onto the substrate by applying 5.0 Watts of power to the ultrasonic nozzle. The wafer was coated by moving the spray head from the center of the wafer to its edge while simultaneously spinning wafer at 50 RPM. For substrate 1, the wafer was then subsequently spun at 2000 rpm for 40 seconds with an acceleration of 40,000 rpm/sec.

The coating solution included 22.5 gms of tetraethoxysilane (TEOS), 22.5 gms of methyltriethoxysilane (MTES), 100 gms of propylene glycol monopropyl ether (PGPE), 24 gms of 0.1N nitric acid, 1.0 gms of tetramethylamonium hydroxide (TMAH)(2.4% in water) and 9.67 gms of Triton X-114 (Triton 114 is trademark of a mixture of ethoxylated p-tert-octylphenols manufactured by the Union Carbide Corporation). The inclusion of methyltriethoxysilane in addition to TEOS introduces methyl moieties that remain in the film and render it hydrophobic, eliminating the need to perform a silyation process in a subsequent step.

Following ultrasonic spray and spin (substrate 1) or spray only (substrates 2 and 3) all substrates were processed according to the following procedures. Wafers were baked on a 180° C. hot plate for 120 seconds in air. Wafers were then transferred into the load lock of an Applied Materials Centura™ Vacuum cluster tool and processed in a standard DxZ chamber using the recipe indicated in Table 1. Alternative apparatus designed more specifically for the purpose of thermally stripping surfactant form mesoporous oxide is also effective and is described in copending U.S. application Ser. No. 09/502,126, assigned to the Assignee herein, and entitled "A PROCESS AND AN INTEGRATED TOOL FOR LOW K DIELECTRIC DEPOSITION INCLUDING A PECVD CAPPING MODULE, which is hereby incorporated herein by reference in its entirety.

TABLE 1

| Described In Step | 1, Pros Pos | 2, Pre Fill | 3, Anneal | 4, Slow Pump | 5, Pump |
|---|---|---|---|---|---|
| Time | 5 sec. | 40 sec. | 180 sec. | 35 sec. | 5 sec. |
| Pressure | Full open | >40 T | Servo 600 T | Throttle 190 | Full open |
| # steps/sec. | 0 | 0 | 0 | 20 | 0 |
| Temp. | 400° C. | 400° C. | 400° C. | 400° C. | 400° C. |
| Spacing | 1325 mils | 1325 mils | 1325 mils | 1325 mils | 1325 mils |
| Htr Power | 1400 mWatts | 1400 mWatts | 1400 mWatts | 1400 mWatts | 1400 mWatts |
| Gas Flow | | $N_2$ 700 scc | $N_2$ 7500 scc $O_2$ 500 scc | $N_2$ 540 scc | $N_2$-1 FPmp |

Following surfactant strip, each wafer was transferred to another chamber for final annealing with nitrogen/vacuum purge cycles to ensure removal of any residual surfactant residue as summarized in the recipe shown in Table 2.

TABLE 2

| Step | Time | Pressure | # steps/sec. | Temp. | Spacing | Htr power | Gas flow |
|---|---|---|---|---|---|---|---|
| 1, Fill | 10 sec. | >40 T | Throttle 80 | 425° C. | 600 mils | 200 mWatts | $N_2$ 5000 scc |
| 2, Anneal | 30 sec. | Servo 50 T | 0 | 425° C. | 600 mils | 200 mWatts | $N_2$ 5000 scc |
| 3, Pump | 30 sec. | Fully open | 50 | 425° C. | 600 mils | 0 mWatts | |
| 4, Fill | 10 sec. | >40 T | Throttle 80 | 425° C. | 600 mils | 200 mWatts | $N_2$ 5000 scc |
| 5, Anneal | 30 sec. | Servo 50 T | 0 | 425° C. | 600 mils | 200 mWatts | $N_2$ 5000 scc |
| 6, Pump | 30 sec. | Fully open | 50 | 425° C. | 600 mils | 0 mWatts | |
| 7, Fill | 10 sec. | >40 T | Throttle 80 | 425° C. | 600 mils | 200 mWatts | $N_2$ 5000 scc |
| 8, Anneal | 35 sec. | Servo 50 T | 0 | 425° C. | 600 mils | 200 mWatts | $N_2$ 5000 scc |
| 9, Pump | 30 sec. | Fully open | 50 | 425° C. | 600 mils | 0 mWatts | |
| 10, Fill | 10 sec. | >40 T | Throttle 80 | 425° C. | 600 mils | 200 mWatts | $N_2$ 5000 scc |
| 11, Anneal | 35 sec. | Servo 50 T | 0 | 425° C. | 600 mils | 200 mWatts | $N_2$ 5000 scc |
| 12, Pump | 60 sec. | Fully open | 50 | 425° C. | 600 mils | 0 mWatts | |

A conventional spin-coating process usually consumes 3–4 ml of precursor solution/per substrate. The inventors found that, by using ultrasonic spray nozzle 22, a similar thickness ELK film can be formed from a substantially reduced amount of precursor solution—between 0.2–1.0 ml/per substrate—up to 90% less solution than a spin coated process.

After formation of the ELK films on substrates 1, 2 and 3, the inventors measured the thickness, refractive index (RI) and dielectric constant (K) of each film. These values are listed below in Table 3.

TABLE 3

|  | THICKNESS | RI | K |
|---|---|---|---|
| Substrate 1 | 5244 Å | 1.24 | 2.25 |
| Substrate 2 | 4449 Å | 1.16 | 2.23 |
| Substrate 3 | 21474 Å | 1.23 | 2.20 |

As evident from Table 3 above, the dielectric constants of each film are similar to those achieve by conventional spin coating process (k=2.3).

Having fully described several embodiments of the present invention, many other equivalent or alternative methods of depositing the low dielectric constant oxide layer according to the present invention will be apparent to those skilled in the art. For example, while the discussion revolving around the film deposition apparatus of FIG. 2 was focused on deposition of a porous silicon oxide ELK material, the apparatus can be used to deposit any dielectric material, including low k and other ELK dielectric materials, as long as the material is deposited from a liquid precursor solution. Also, while a single ultrasonic spray nozzle was used in the embodiments of FIGS. 2 and 5, multiple nozzles can be used in other embodiments to alleviate the need for track 24. These equivalents and alternatives are intended to be included within the scope of the present invention that is set forth in the following claims.

What is claimed is:

1. A process for forming an extremely low dielectric constant film over a substrate, said process comprising:

coating said substrate with a solution comprising a soluble source of silicon oxide, water, a solvent, a surfactant and a catalyst using an ultrasonic spray nozzle, wherein said solution is delivered to said ultrasonic spray nozzle from at least first and second separate sources that are combined at or immediately prior to said ultrasonic spray nozzle; and treating said coated substrate to harden the solution into said extremely low dielectric constant film.

2. The method of claim 1 wherein said coating step is performed in a sealed chamber having an exhaust port.

3. The method of claim 2 wherein said substrate is positioned within said sealed chamber on a rotatable substrate support during said coating step and said substrate is rotated during said coating step.

4. The method of claim 3 wherein during said coating step said ultrasonic spray nozzle is moved along a track while spraying said solution toward said substrate.

5. The method of claim 2 wherein said coating step comprises scanning said ultrasonic spray nozzle across an upper surface of said substrate.

6. The method of claim 5 wherein said scanning wherein said scanning moves said ultrasonic spray nozzle along a first x axis and a second y axis.

7. The method of claim 2 wherein said solvent has a boiling point below 100° C.

8. The method of claim 7 wherein said solvent is selected from the group consisting of ethanol, isopropanol and methanol.

9. The method of claim 1 wherein said catalyst is an acid catalyst.

10. The method of claim 1 wherein said first source comprises said soluble source of silicon oxide, said solvent and said surfactant and said second source comprises said water.

11. The method of claim 1 wherein said extremely low dielectric constant film is a interconnected porous structured silicon oxide film.

12. A process for forming an extremely low dielectric constant film over a substrate according to claim 1 wherein the first and second separate sources are combined at the ultrasonic spray nozzle and homogenized by the spray nozzle without the use of a separate mixing tank.

13. A process for forming an extremely low dielectric constant film over a substrate, said process comprising:

coating said substrate with a solution comprising a soluble source of silicon oxide, water, a solvent, a surfactant and a catalyst using an ultrasonic spray nozzle in a vacuum chamber having an exhaust port and a vacuum pump operatively coupled to the exhaust port to enable the creation of a reduced pressure atmosphere within the chamber; and treating said coated substrate to harden the solution into said extremely low dielectric constant film.

14. The process of claim 13 wherein said solution is delivered to said ultrasonic spray nozzle from at least first and second separate sources that are combined at or immediately prior to said ultrasonic spray nozzle.

\* \* \* \* \*